United States Patent
Sai (10) Patent No.: US 10,998,451 B2
(45) Date of Patent: May 4, 2021

(54) ESD PROTECTION DIODE

(71) Applicants: Kabushiki Kaisha Toshiba, Tokyo (JP); Toshiba Electronic Devices & Storage Corporation, Tokyo (JP)

(72) Inventor: Hideaki Sai, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/558,911

(22) Filed: Sep. 3, 2019

(65) Prior Publication Data

US 2020/0266303 A1    Aug. 20, 2020

(30) Foreign Application Priority Data

Feb. 15, 2019    (JP) .............................. JP2019-026009

(51) Int. Cl.
*H01L 23/62*    (2006.01)
*H01L 29/861*    (2006.01)
(Continued)

(52) U.S. Cl.
CPC ...... *H01L 29/8611* (2013.01); *H01L 27/0248* (2013.01); *H01L 27/0255* (2013.01);
(Continued)

(58) Field of Classification Search
CPC ............. H01L 29/8611; H01L 27/0255; H01L 29/0611; H01L 27/0248; H01L 23/62; H01L 23/552
See application file for complete search history.

(56) References Cited

U.S. PATENT DOCUMENTS 5,757,034 A * 5/1998 Ajit .................... H01L 29/7455
257/132
5,905,282 A   5/1999 Sato et al.
(Continued)

FOREIGN PATENT DOCUMENTS

| JP | H06-302808 A | 10/1994 |
| JP | 3131823 B2 | 2/2001 |
| JP | 2012-104834 A | 5/2012 |

*Primary Examiner* — Alonzo Chambliss
(74) *Attorney, Agent, or Firm* — White & Case LLP (57) ABSTRACT

A semiconductor device according to an embodiment includes a semiconductor layer that has first and second plane and includes first-conductivity-type first semiconductor region, second-conductivity-type second semiconductor region between the first semiconductor region and the first plane, first-conductivity-type third semiconductor region between the second semiconductor region and the first plane and has a lower first-conductivity-type impurity concentration than the first semiconductor region, and second-conductivity-type fourth semiconductor region between the third semiconductor region and the first plane and has a higher second-conductivity-type impurity concentration than the second semiconductor region; a first electrode on a side of the first plane of the semiconductor layer and is electrically connected to the third semiconductor region and the fourth semiconductor region; and a second electrode on a side of the second plane of the semiconductor layer, is electrically connected to the first semiconductor region, and is not electrically connected to the second semiconductor region.

9 Claims, 6 Drawing Sheets

(51) Int. Cl.
*H01L 29/06* (2006.01)
*H01L 27/02* (2006.01)
*H01L 23/552* (2006.01)

(52) U.S. Cl.
CPC ........ *H01L 29/0611* (2013.01); *H01L 23/552* (2013.01); *H01L 23/62* (2013.01)

(56) References Cited

U.S. PATENT DOCUMENTS

| | | | | |
|---|---|---|---|---|
| 7,859,010 | B2 * | 12/2010 | Inoue | H01L 29/87 257/110 |
| 8,390,092 | B2 | 3/2013 | Gendron et al. | |
| 9,379,203 | B2 * | 6/2016 | Veeramma | H01L 29/74 |
| 9,806,157 | B2 * | 10/2017 | Bolotnikov | H01L 29/1608 |
| 2010/0001783 | A1 * | 1/2010 | Ronsisvalle | H01L 29/742 327/438 |
| 2020/0091134 | A1 * | 3/2020 | Sai | H01L 27/0262 |

* cited by examiner

ESD PROTECTION DIODE

CROSS-REFERENCE TO RELATED APPLICATION

This application is based upon and claims the benefit of priority from Japanese Patent Application No. 2019-026009, filed on Feb. 15, 2019, the entire contents of which are incorporated herein by reference.

FIELD

Embodiments described herein relate generally to semiconductor devices.

BACKGROUND

Electrostatic discharge (ESD) is a phenomenon in which a current flows instantaneously in a case in which two objects, such as the human body and an electronic apparatus, come into contact with each other. ESD protection diodes are used to protect electronic apparatuses from a surge current caused by ESD penetration into the electronic apparatuses.

For example, the ESD protection diode is connected between a signal line extending from an input/output terminal of the electronic apparatus to a device to be protected and the ground. In a case in which ESD is applied from the input/output terminal to the signal line, most of the surge current flows to the ground through the ESD protection diode and a portion of the surge current flows as a residual current to the device to be protected.

With the scaling-down of the device to be protected, it is necessary to further reduce the residual current flowing to the device to be protected. In order to reduce the residual current, it is necessary to reduce the clamp voltage and dynamic resistance of the ESD protection diode. The clamp voltage is a voltage generated between both terminals of the ESD protection diode in a case in which the surge current flows to the ESD protection diode. The dynamic resistance is resistance between both terminals of the ESD protection diode in a case in which the surge current flows to the ESD protection diode.

In order to reduce the clamp voltage, a thyristor structure or a transistor structure having snapback characteristics is used as the ESD protection diode. In particular, in the ESD protection diode having the thyristor structure, a hold voltage is low at the time of a snapback operation. Therefore, it is possible to significantly reduce the clamp voltage. The hold voltage is the lowest voltage at the time of the snapback operation.

However, for example, in a case in which a device having an input/output terminal capable of driving a current, such as an HDMI terminal, is protected and the hold voltage is too low, there is a concern that latch-up will occur in the ESD protection diode. That is, in a case in which the hold voltage is lower than the signal level of the signal line, ESD penetration from the input/output terminal is stopped. In a case in which the signal line returns to the signal level, there is a concern that latch-up will occur in the ESD protection diode. Therefore, different types of ESD protection diodes having different hold voltages according to, for example, the type of input/output terminal are required.

DETAILED DESCRIPTION

A semiconductor device according to an embodiment includes a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region; a first electrode provided on a side of the first plane of the semiconductor layer, the first electrode being electrically connected to the third semiconductor region and the fourth semiconductor region; and a second electrode provided on a side of the second plane of the semiconductor layer, the second electrode being electrically connected to the first semiconductor region, the second electrode not being electrically connected to the second semiconductor region.

In the specification, in some cases, the same or similar members are denoted by the same reference numerals and the description thereof will not be repeated.

In the following description, in some cases, the notation of $n^+$, n, $n^-$, $p^+$, p, and $p^-$ is used. This notation indicates the relative impurity concentration levels of each conductivity type. That is, $n^+$ indicates a higher n-type impurity concentration than n and $n^-$ indicates a lower n-type impurity concentration than n. In addition, $p^+$ indicates a higher p-type impurity concentration than p and $p^-$ indicates a lower p-type impurity concentration than p. In some cases, an $n^+$ type and an $n^-$ type are simply referred to as an n type and a $p^+$ type and a $p^-$ type are simply referred to as a p type.

In the following description, "an electrode being electrically connected to a semiconductor region" means that an insulating layer or a pn junction which becomes a current barrier is not provided between the electrode and the semiconductor region. In addition, "an electrode not being electrically connected to a semiconductor region" means that an insulating layer or a pn junction which becomes a current barrier is provided between the electrode and the semiconductor region.

Impurity concentration can be measured by, for example, secondary ion mass spectrometry (SIMS). In addition, the relative impurity concentration level can be determined from a carrier concentration level calculated by, for example, scanning capacitance microscopy (SCM). A distance, such as the depth or thickness of an impurity region, can be calculated by for example, SIMS. Further, a distance, such as the depth, thickness, width, or interval of impurity regions, can be calculated from, for example, an SCM image or a composite image of an SCM image and an atomic force microscope (AFM) image.

First Embodiment

A semiconductor device according to a first embodiment includes a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region; a first electrode provided on a side of the first plane of the semiconductor layer, the first electrode being electrically connected to the third semiconductor region and the fourth semiconductor region; and a second electrode provided on a side of the second plane of the semiconductor layer, the second electrode being electrically connected to the first semiconductor region, the second electrode not being electrically connected to the second semiconductor region.

Figure 1:
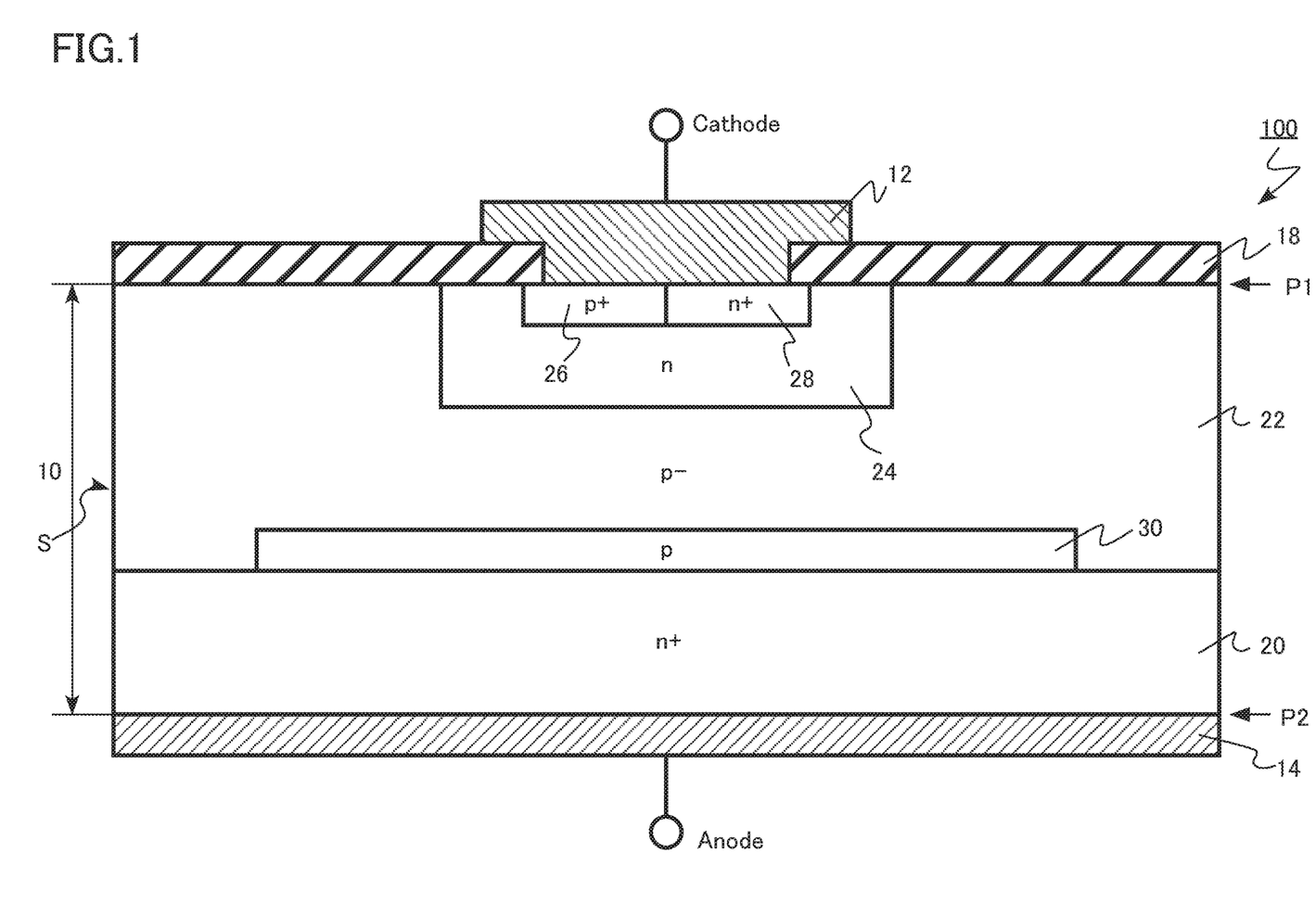
FIG. 1 is a cross-sectional view schematically illustrating a semiconductor device according to a first embodiment.

FIG. 1 is a cross-sectional view schematically illustrating the semiconductor device according to the first embodiment.

The semiconductor device according to the first embodiment is an ESD protection diode 100. The ESD protection diode 100 is an ESD protection diode in which a current can flow in both directions between two electrodes.

Hereinafter, a case in which a first conductivity type is an n type and a second conductivity type is a p type will be described as an example.

The ESD protection diode 100 includes a semiconductor layer 10, a cathode electrode 12 (first electrode), an anode electrode 14 (second electrode), and a protective insulating layer 18.

The semiconductor layer 10 has a first plane (P1 in FIG. 1) and a second plane (P2 in FIG. 1) opposite to the first plane. The first plane P1 is a front surface of the semiconductor layer 10 and the second plane P2 is a rear surface of the semiconductor layer 10.

In addition, the semiconductor layer 10 has an end surface S. The end surface S is located between the first plane P1 and the second plane P2.

The semiconductor layer 10 includes an n$^+$ substrate region 20 (first semiconductor region), a p$^-$ anode region 22 (second semiconductor region), an n-type cathode region 24 (third semiconductor region), a p$^+$ first contact region 26 (fourth semiconductor region), an n$^+$ second contact region 28 (eighth semiconductor region), and a p-type first barrier region 30 (fifth semiconductor region).

The semiconductor layer 10 is, for example, a silicon (Si) single-crystal layer. The first plane P1 is, for example, the (001) face of silicon. The thickness of the semiconductor layer 10 is, for example, equal to or greater than 80 μm and equal to or less than 200 μm.

The n$^+$ substrate region 20 is an impurity region including n-type impurities. The substrate region 20 is provided so as to come into contact with the second plane P2.

The substrate region 20 includes, for example, phosphorus (P), arsenic (As), or antimony (Sb) as the n-type impurities. The n-type impurity concentration of the substrate region 20 is, for example, equal to or greater than $5\times10^{19}$ cm$^{-3}$ and equal to or less than $5\times10^{21}$ cm$^{-3}$.

The thickness of the substrate region 20 in a direction from the first plane P1 to the second plane P2 is, for example, equal to or greater than 50 μm and equal to or less than 150 μm.

The p anode region 22 is provided between the substrate region 20 and the first plane P1. A portion of the anode region 22 comes into contact with the first plane P1.

The anode region 22 includes, for example, boron (B) asp-type impurities. The p-type impurity concentration of the anode region 22 is, for example, equal to or greater than $5\times10^{12}$ cm$^{-3}$ and equal to or less than $1\times10^{14}$ cm$^{-3}$.

The thickness of the anode region 22 in the direction from the first plane P1 to the second plane P2 is, for example, equal to or greater than 3 μm and equal to or less than 20 μm.

The anode region 22 is, for example, an epitaxial layer that is formed on the substrate region 20 by an epitaxial growth method.

The n-type cathode region 24 is provided between the anode region 22 and the first plane P1. A portion of the cathode region 24 comes into contact with the first plane P1.

The cathode region 24 includes, for example, phosphorus (P) or arsenic (As) as n-type impurities. The n-type impurity concentration of the cathode region 24 is lower than the n-type impurity concentration of the substrate region 20. The n-type impurity concentration of the cathode region 24 is, for example, equal to or greater than $5\times10^{15}$ cm$^{-3}$ and equal to or less than $1\times10^{19}$ cm$^{-3}$.

The thickness of the cathode region 24 in a direction perpendicular to the first plane P1 is, for example, equal to or greater than 0.5 μm and equal to or less than 2 μm. In other words, the depth of the cathode region 24 from the first plane P1 is, for example, equal to or greater than 0.5 μm and equal to or less than 2 μm.

The cathode region 24 is formed by, for example, implanting n-type impurity ions into the semiconductor layer 10 and thermally diffusing the n-type impurities.

The p$^+$ first contact region 26 is provided between the cathode region 24 and the first plane P1. A portion of the first contact region 26 comes into contact with the first plane P1.

The first contact region 26 includes, for example, boron (B) as p-type impurities. The p-type impurity concentration of the first contact region 26 is higher than the p-type impurity concentration of the anode region 22. The p-type impurity concentration of the first contact region 26 is, for example, equal to or greater than $5\times10^{19}$ cm$^{-3}$ and equal to or less than $5\times10^{21}$ cm$^{-3}$.

The thickness of the first contact region 26 in the direction perpendicular to the first plane P1 is, for example, equal to or greater than 0.1 μm and equal to or less than 0.5 μm. In other words, the depth of the first contact region 26 from the first plane P1 is, for example, equal to or greater than 0.1 μm and equal to or less than 0.5 μm.

The first contact region 26 is formed by, for example, implanting p-type impurity ions into the semiconductor layer 10 and performing a heat treatment to activate the p-type impurities.

The n+ second contact region 28 is provided between the cathode region 24 and the first plane P1. A portion of the second contact region 28 comes into contact with the first plane P1.

The second contact region 28 includes, for example, phosphorus (P) or arsenic (As) as n-type impurities. The n-type impurity concentration of the second contact region 28 is higher than the n-type impurity concentration of the cathode region 24. The n-type impurity concentration of the second contact region 28 is, for example, equal to or greater than $5 \times 10^{19}$ cm$^{-3}$ and equal to or less than $5 \times 10^{21}$ cm$^{-3}$.

The thickness of the second contact region 28 in the direction perpendicular to the first plane P1 is, for example, equal to or greater than 0.1 μm and equal to or less 0.5 μm. In other words, the depth of the second contact region 28 from the first plane P1 is, for example, equal to or greater than 0.1 μm and equal to or less 0.5 μm.

The second contact region 28 is formed by, for example, implanting n-type impurity ions into the semiconductor layer 10 and performing a heat treatment to activate the n-type impurities.

The p-type first barrier region 30 is provided between the substrate region 20 and the anode region 22. The first barrier region 30 comes into contact with the substrate region 20. The first barrier region 30 comes into contact with the p anode region 22.

The first barrier region 30 includes, for example, boron (B) as p-type impurities. The p-type impurity concentration of the first barrier region 30 is higher than the p-type impurity concentration of the anode region 22. The p-type impurity concentration of the first barrier region 30 is, for example, equal to or greater than $1 \times 10^{16}$ cm$^{-3}$ and equal to or less than $5 \times 10^{18}$ cm$^{-3}$.

The thickness of the first barrier region 30 in the direction perpendicular to the first plane P1 is less than the thickness of the anode region 22 in the direction perpendicular to the first plane P1.

For example, the first barrier region 30 is formed by selectively implanting p-type impurity ions into the front surface of the substrate region 20 before the anode region 22 is formed on the substrate region 20 by epitaxial growth. At the time of epitaxial growth, the p-type impurities are diffused to the anode region 22 to form the first barrier region 30.

The anode region 22 comes into contact with the end surface S of the semiconductor layer 10. The anode region 22 comes into contact with the first plane P1 between the end surface S and the cathode region 24.

The first barrier region 30 is separated from the end surface S. The anode region 22 is provided between the end surface S and the first barrier region 30.

The protective insulating layer 18 is provided on the first plane P1 of the semiconductor layer 10. The protective insulating layer 18 includes, for example, silicon oxide.

The cathode electrode 12 is provided on the side of the first plane P1 of the semiconductor layer 10. The cathode electrode 12 is provided on the first plane P1 of the semiconductor layer 10.

The cathode electrode 12 is electrically connected to the cathode region 24, the first contact region 26, and the second contact region 28. The cathode electrode 12 comes into contact with the first contact region 26 and the second contact region 28.

The cathode electrode 12 is made of, for example, metal. The cathode electrode 12 includes, for example, aluminum or an aluminum alloy. For example, a barrier metal layer (not illustrated) is provided in a portion of the cathode electrode 12 which comes into contact with the semiconductor layer 10. The barrier metal layer includes, for example, titanium, titanium nitride, or tungsten nitride.

The anode electrode 14 is provided on the side of the second plane P2 of the semiconductor layer 10. The anode electrode 14 comes into contact with the second plane P2 of the semiconductor layer 10.

The anode electrode 14 is electrically connected to the substrate region 20. The anode electrode 14 comes into contact with the substrate region 20.

The anode electrode 14 is not electrically connected to the anode region 22. The anode electrode 14 is separated from the anode region 22. The anode electrode 14 does not come into contact with the anode region 22.

The anode electrode 14 is not electrically connected to first barrier region 30. The anode electrode 14 is separated from the first barrier region 30. The anode electrode 14 does not come into contact with the first barrier region 30.

The anode electrode 14 is made of, for example, metal. The anode electrode 14 includes, for example, gold, silver, or a tin alloy.

The ESD protection diode 100 according to the first embodiment has a pnpn thyristor structure of the p+ first contact region 26, the n-type cathode region 24, the p− anode region 22, and the n+ substrate region 20. In addition, the ESD protection diode 100 according to the first embodiment has an npn transistor structure of the n+ substrate region 20, the p− anode region 22, and the n-type cathode region 24.

Next, the function and effect of the semiconductor device according to the first embodiment will be described.

For example, the ESD protection diode is connected between a signal line extending from an input/output terminal of an electronic device to a device to be protected and the ground. In a case in which ESD is applied from the input/output terminal to the signal line, most of the surge current flows to the ground through the ESD protection diode and a portion of the surge current flows as a residual current to the device to be protected.

With the scaling-down of the device to be protected, it is necessary to further reduce the residual current flowing to the device to be protected. In order to reduce the residual current, it is necessary to reduce the clamp voltage and dynamic resistance of the ESD protection diode. The clamp voltage is a voltage generated between both terminals of the ESD protection diode in a case in which the surge current flows to the ESD protection diode. The dynamic resistance is resistance between both terminals of the ESD protection diode in a case in which the surge current flows to the ESD protection diode.

In order to reduce the clamp voltage, a thyristor structure or a transistor structure having snapback characteristics is used as the ESD protection diode. In particular, in the ESD protection diode having the thyristor structure, a hold voltage is low at the time of a snapback operation. Therefore, it is possible to significantly reduce the clamp voltage. The hold voltage is the lowest voltage at the time of the snapback operation.

Figure 2:
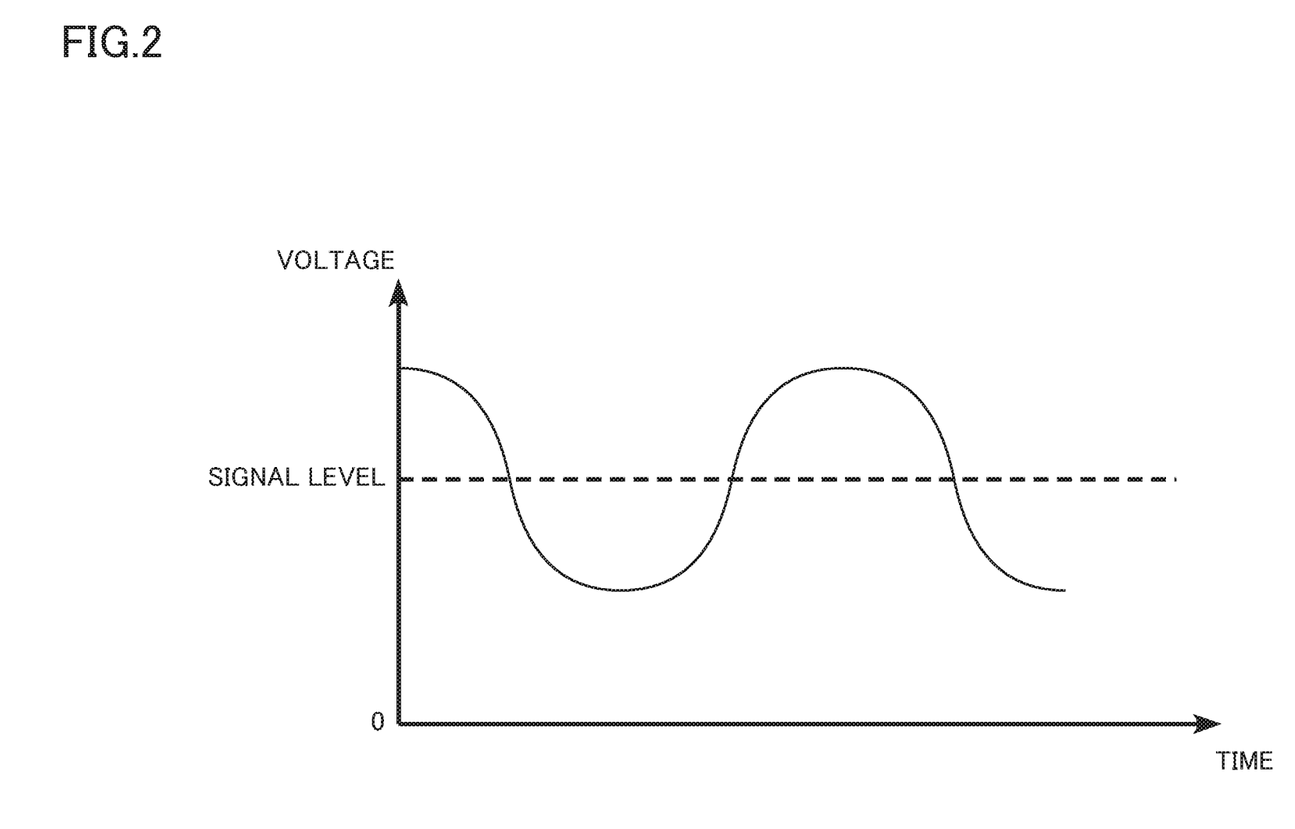
FIG. 2 is a diagram illustrating the function and effect of the semiconductor device according to the first embodiment.
Figure 3:
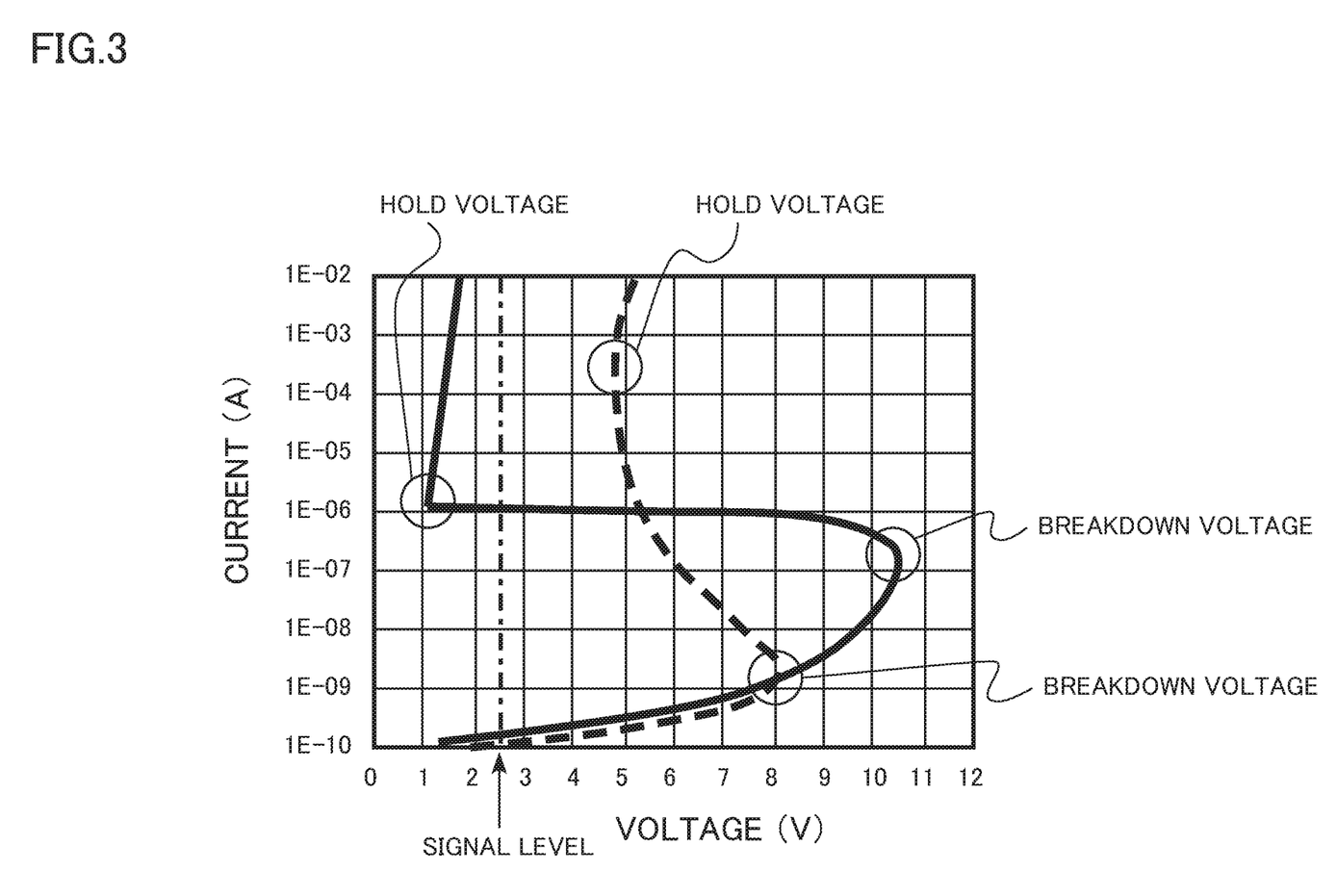
FIG. 3 is a diagram illustrating the function and effect of the semiconductor device according to the first embodiment.

FIGS. 2 and 3 are diagrams illustrating the function and effect of the semiconductor device according to the first embodiment. FIG. 2 is a diagram illustrating an example of the voltage waveform of a signal transmitted through the signal line. FIG. 3 illustrates the snapback characteristics (a solid line in FIG. 3) of the ESD protection diode having the thyristor structure and the snapback characteristics (a dotted line in FIG. 3) of the ESD protection diode having the transistor structure.

For example, as illustrated in FIG. 2, the voltage waveform of the signal transmitted through the signal line between an input/output terminal capable of driving a current, such as an HDMI terminal, and the device to be protected oscillates on the basis of a signal level with a predetermined voltage.

As illustrated in FIG. 3, in the ESD protection diode having the thyristor structure, the hold voltage is lower than that in the ESD protection diode having the transistor structure. For example, in a case in which the device to be protected which has the input/output terminal capable of driving a current, such as an HDMI terminal, is protected and the hold voltage is lower than the signal level, there is a concern that latch-up will occur in the ESD protection diode.

As illustrated in FIG. 3, in a case in which the hold voltage of the ESD protection diode having the thyristor structure is lower than the signal level of the signal line, ESD penetration from the input/output terminal is stopped. In a case in which the signal line returns to the signal level, there is a concern that latch-up will occur in the ESD protection diode.

Therefore, in a case in which a device including an input/output terminal capable of deriving a current, such as an HDMI terminal, is protected, it is preferable to use an ESD protection diode having a transistor structure with a relatively high hold voltage.

That is, different types of ESD protection diodes with different hold voltages are required according to the type of input/output terminal. For example, in a case in which an electronic apparatus has two different types of input/output terminals, it is necessary to provide two types of ESD protection diodes and the number of types of components of the electronic apparatus increases. The increase in the number of types of components of the electronic apparatus may lead to an increase in the cost of the electronic apparatus.

In the ESD protection diode 100 according to the first embodiment, the cathode electrode 12 is connected to the signal line and the anode electrode 14 is connected to the ground. Therefore, the ESD protection diode 100 functions as an ESD protection diode having a thyristor structure. In contrast, in the ESD protection diode 100, the anode electrode 14 is connected to the signal line and the cathode electrode 12 is connected to the ground. Therefore, the ESD protection diode 100 functions as an ESD protection diode having a transistor structure.

Therefore, in the ESD protection diode 100 according to the first embodiment, it is possible to achieve two hold voltages only by changing the connection direction. As a result, for example, it is possible to prevent an increase in the number of types of components of the electronic apparatus and to reduce the cost of the electronic apparatus.

In the ESD protection diode 100, it is preferable that the p-type first barrier region 30 is provided between the n$^+$ substrate region 20 and the p anode region 22. A leakage current in a state in which no surge current flows is suppressed by providing the first barrier region 30 in a case in which the ESD protection diode 100 is used as an ESD protection diode having a thyristor structure. Therefore, the breakdown voltage increases.

Since the leakage current is suppressed by providing the first barrier region 30, it is possible to reduce the p-type impurity concentration of the anode region 22. Therefore, it is possible to reduce the capacity of the ESD protection diode 100. As a result, the deterioration of the characteristics of the signal transmitted through the signal line is suppressed.

The p-type impurity concentration of the first barrier region 30 is preferably equal to or greater than $1 \times 10^{16}$ cm$^{-3}$ and equal to or less than $5 \times 10^{18}$ cm$^{-3}$ and more preferably equal to or greater than $5 \times 10^{16}$ cm$^{-3}$ and equal to or less than $1 \times 10^{18}$ cm$^{-3}$.

In a case in which the p-type impurity concentration of the first barrier region 30 is high and the ESD protection diode 100 is used as an ESD protection diode having a thyristor structure, the breakdown voltage increases. In contrast, in a case in which the ESD protection diode 100 is used as an ESD protection diode having a transistor structure, the breakdown voltage is reduced.

The p-type impurity concentration of the first barrier region 30 falling within the above-mentioned range makes it possible to achieve an appropriate breakdown voltage even in a case in which the ESD protection diode 100 is used as either the ESD protection diode having a thyristor structure or the ESD protection diode having a transistor structure.

The thickness of the first barrier region 30 in the direction perpendicular to the first plane P1 is preferably less than the thickness of the anode region 22 in the direction perpendicular to the first plane P1. In a case in which the thickness of the anode region 22 is small, there is a concern that punch-through will occur between the cathode region 24 and the substrate region 20. In a case in which the thickness of the first barrier region 30 is large, there is a concern that the breakdown voltage will be too high.

The p-type impurity concentration of the anode region 22 is preferably equal to or greater than $5 \times 10^{12}$ cm$^{-3}$ and equal to or less than $1 \times 10^{14}$ cm$^{-3}$. In a case in which the p-type impurity concentration exceeds the lower limit, it is possible to reduce dynamic resistance.

In a case in which the p-type impurity concentration is less than the upper limit, it is possible to reduce the capacity of the ESD protection diode 100. Therefore, the deterioration of the characteristics of the signal transmitted through the signal line is suppressed.

The end surface S of the ESD protection diode 100 is formed when the semiconductor wafer is diced. The semiconductor wafer is diced by, for example, blade dicing. The crystallinity of the semiconductor layer 10 in the vicinity of the end face S is degraded by, for example, the influence of blade dicing.

Therefore, in a case in which a pn junction between an n-type impurity region and a p-type impurity region with a high impurity concentration is terminated in the end surface S, the amount of leakage current of the pn junction increases. As a result, there is a concern that the characteristics of the ESD protection diode will deteriorate.

In the ESD protection diode 100, the first barrier region 30 is separated from the end surface S. Therefore, the pn junction between the substrate region 20 with a high n-type impurity concentration and the first barrier region 30 with a high p-type impurity concentration is not terminated in the end surface S. Therefore, the deterioration of the characteristics of the ESD protection diode 100 is suppressed.

As described above, according to the first embodiment, the connection direction is changed to achieve an ESD protection diode with two hold voltages.

Second Embodiment

A semiconductor device according to a second embodiment differs from the semiconductor device according to the first embodiment in that a semiconductor layer includes a second-conductivity-type sixth semiconductor region which is provided between the end surface and the second semiconductor region and comes into contact with the first plane and the fifth semiconductor region and a first-conductivity-type seventh semiconductor region which is provided between the end surface and the sixth semiconductor region and comes into contact with the first plane and the first semiconductor region.

Hereinafter, the description of a portion of the same content as that in the first embodiment will not be repeated.

Figure 4:
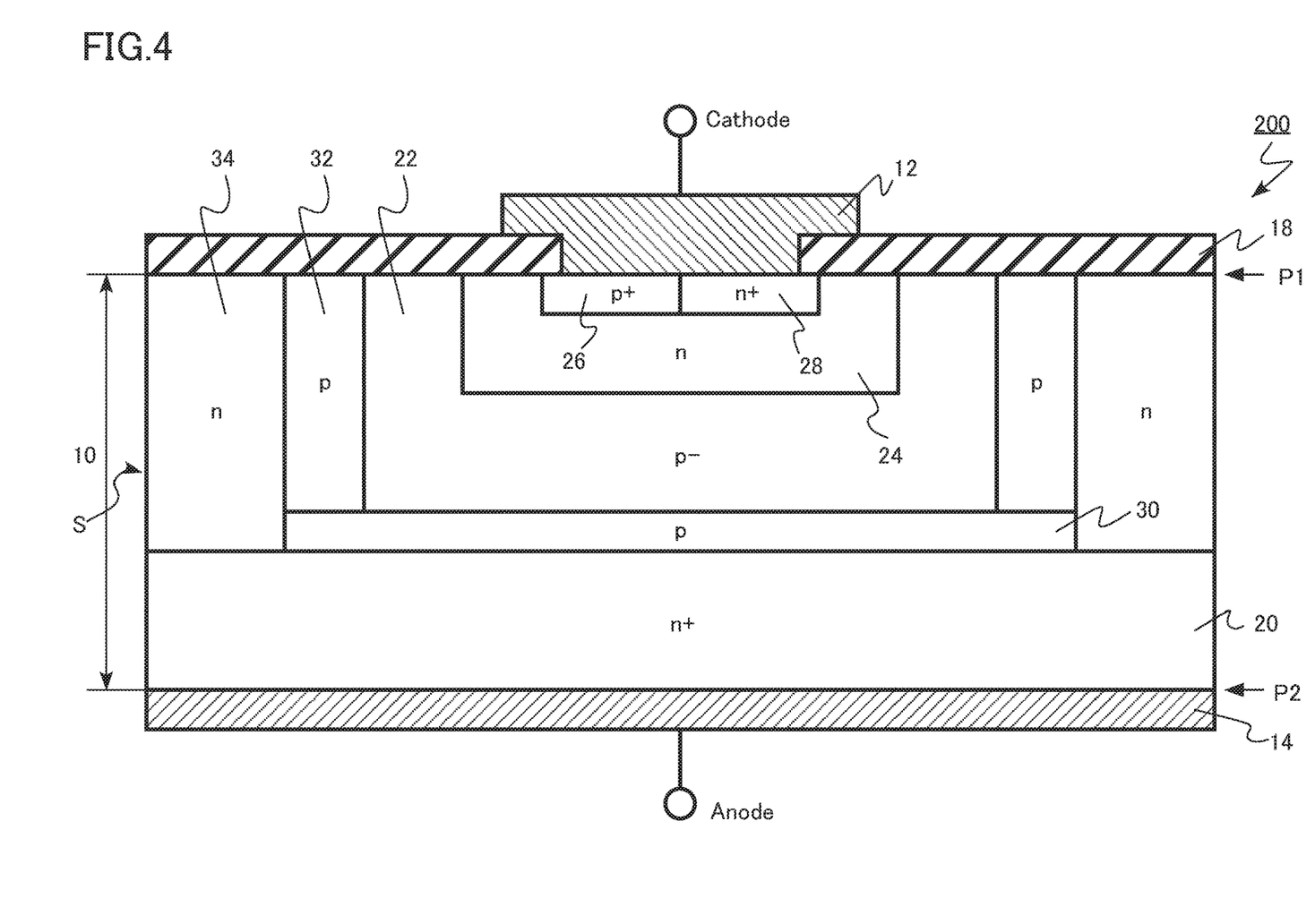
FIG. 4 is a cross-sectional view schematically illustrating a semiconductor device according to a second embodiment.

FIG. 4 is a cross-sectional view schematically illustrating the semiconductor device according to the second embodiment.

The semiconductor device according to the second embodiment is an ESD protection diode 200. The ESD protection diode 200 is an ESD protection diode in which a current can flow in both directions between two electrodes.

Hereinafter, a casein which the first conductivity type is an n type and the second conductivity type is a p type will be described as an example.

The ESD protection diode 200 includes a semiconductor layer 10, a cathode electrode 12 (first electrode), an anode electrode 14 (second electrode), and a protective insulating layer 18.

The semiconductor layer 10 has a first plane (P1 in FIG. 4) and a second plane (P2 in FIG. 4). The first plane P1 is a front surface of the semiconductor layer 10 and the second plane P2 is a rear surface of the semiconductor layer 10.

In addition, the semiconductor layer 10 has an end surface S. The end surface S is located between the first plane P1 and the second plane P2.

The semiconductor layer 10 includes an n$^+$ substrate region 20 (first semiconductor region), a p$^-$ anode region 22 (second semiconductor region), an n-type cathode region 24 (third semiconductor region), a p$^+$ first contact region 26 (fourth semiconductor region), an n$^+$ second contact region 28 (eighth semiconductor region), a p-type first barrier region 30 (fifth semiconductor region), a p-type second barrier region 32 (sixth semiconductor region), and an n-type end region 34 (seventh semiconductor region).

The p-type second barrier region 32 is provided between the end surface S and the anode region 22. The second barrier region 32 comes into contact with the first plane P1 and the first barrier region 30. The second barrier region 32 comes into contact with the anode region 22.

The second barrier region 32 includes, for example, boron (B) as p-type impurities. The p-type impurity concentration of the second barrier region 32 is higher than the p-type impurity concentration of the anode region 22. The p-type impurity concentration of the second barrier region 32 is, for example, equal to or greater than $1 \times 10^{16}$ cm$^{-3}$ and equal to or less than $5 \times 10^{18}$ cm$^{-3}$.

The second barrier region 32 is formed by, for example, implanting p-type impurity ions into the semiconductor layer 10 and performing a heat treatment to thermally diffusing the p-type impurities.

The n-type end region 34 is provided between the end surface S and the second barrier region 32. The end region 34 comes into contact with the first plane P1 and the substrate region 20.

The end region 34 includes, for example, phosphorus (P) or arsenic (As) as n-type impurities. The n-type impurity concentration of the end region 34 is lower than the n-type impurity concentration of the substrate region 20. The n-type impurity concentration of the end region 34 is, for example, equal to or greater than $5 \times 10^{16}$ cm$^{-3}$ and equal to or less than $1 \times 10^{19}$ cm$^{-3}$.

The end region 34 is formed by, for example, implanting n-type impurity ions into the semiconductor layer 10 and thermally diffusing the n-type impurities.

In the ESD protection diode 200, the n-type end region 34 is provided such that the pn junction is not terminated in the end surface S. Therefore, the deterioration of the characteristics of the ESD protection diode 200 caused by a leakage current in the end surface S is suppressed.

A leakage current in a state in which no surge current flows is suppressed by providing the second barrier region 32 between the anode region 22 and the end region 34 in a case in which the ESD protection diode 200 is used as an ESD protection diode having a thyristor structure. Therefore, the breakdown voltage increases.

As described above, according to the second embodiment, similarly to the first embodiment, the connection direction is changed to achieve an ESD protection diode with two hold voltages. In addition, the deterioration of the characteristics of the ESD protection diode caused by a leakage current in the end surface is suppressed.

Third Embodiment

A semiconductor device according to a third embodiment differs from the semiconductor device according to the first embodiment in that a semiconductor layer includes an insulator provided between the end surface and the fifth semiconductor region. Hereinafter, the description of a portion of the same content as that in the first embodiment will not be repeated.

Figure 5:
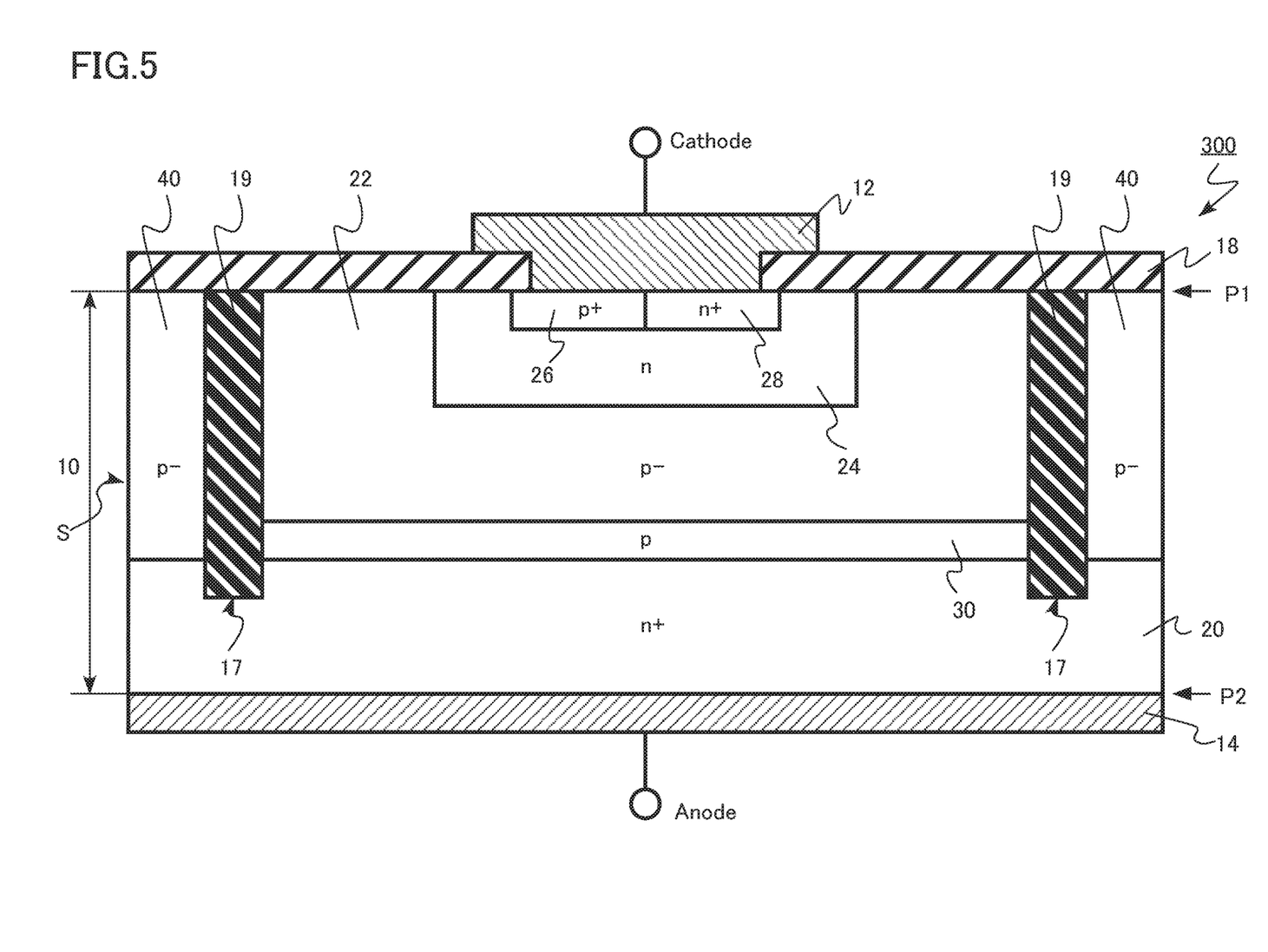
FIG. 5 is a cross-sectional view schematically illustrating a semiconductor device according to a third embodiment.

FIG. 5 is a cross-sectional view schematically illustrating the semiconductor device according to the third embodiment.

The semiconductor device according to the third embodiment is an ESD protection diode 300. The ESD protection diode 300 is an ESD protection diode in which a current can flow in both directions between two electrodes.

Hereinafter, a casein which the first conductivity type is an n type and the second conductivity type is a p type will be described as an example.

The ESD protection diode 300 includes a semiconductor layer 10, a cathode electrode 12 (first electrode), an anode electrode 14 (second electrode), and a protective insulating layer 18.

The semiconductor layer 10 has a first plane (P1 in FIG. 5) and a second plane (P2 in FIG. 5). The first plane P1 is a front surface of the semiconductor layer 10 and the second plane P2 is a rear surface of the semiconductor layer 10.

In addition, the semiconductor layer 10 has an end surface S. The end surface S is located between the first plane P1 and the second plane P2.

The semiconductor layer 10 includes an n$^+$ substrate region 20 (first semiconductor region), a p$^-$ anode region 22 (second semiconductor region), an n-type cathode region 24 (third semiconductor region), a p$^+$ first contact region 26 (fourth semiconductor region), an n$^+$ second contact region 28 (eighth semiconductor region), a p-type first barrier region 30 (fifth semiconductor region), a p$^-$ end region 40, a trench 17, and a buried insulating layer 19 (insulator).

The p$^-$ end region 40 is provided between the substrate region 20 and the first plane P1. The end region 40 comes into contact with the end surface S. A portion of the end region 40 comes into contact with the first plane P1. The end region 40 is provided between the end surface S and the anode region 22. The end region 40 is provided between the end surface S and the trench 17.

The end region 40 includes, for example, boron (B) as p-type impurities. The p-type impurity concentration of the anode region 22 is, for example, equal to or greater than $5\times10^{12}$ cm$^{-3}$ and equal to or less than $1\times10^{14}$ cm$^{-3}$.

For example, the end region 40 is formed on the substrate region 20 by an epitaxial growth method at the same time as the anode region 22.

The trench 17 is formed in the semiconductor layer 10. The trench 17 extends from the first plane P1 of the semiconductor layer 10 to the substrate region 20 through the anode region 22. The trench 17 is formed by, for example, etching the semiconductor layer 10 from the first plane P1 using an anisotropic etching method.

The buried insulating layer 19 is provided in the trench 17. The buried insulating layer 19 is provided between the end surface S and the p-type first barrier region 30. The buried insulating layer 19 is interposed between the anode region 22 and the end region 40. The buried insulating layer 19 is interposed between the first barrier region 30 and the end region 40.

The buried insulating layer 19 electrically separates the anode region 22 from the end region 40. The buried insulating layer 19 electrically separates the first barrier region 30 from the end region 40.

The buried insulating layer 19 is an example of an insulator. The buried insulating layer 19 includes, for example, silicon oxide.

In the ESD protection diode 300, a pn junction between the first barrier region 30 and the substrate region 20 and a pn junction between the anode region 22 and the substrate region 20 are not terminated in the end surface S by providing the buried insulating layer 19. Therefore, the deterioration of the characteristics of the ESD protection diode 300 caused by a leakage current in the end surface S is suppressed.

As described above, according to the third embodiment, similarly to the first embodiment, the connection direction is changed to achieve an ESD protection diode with two hold voltages. In addition, the deterioration of the characteristics of the ESD protection diode caused by a leakage current in the end surface is suppressed.

Fourth Embodiment

A semiconductor device according to a fourth embodiment differs from the semiconductor device according to the first embodiment in that an end surface of a semiconductor layer is inclined such that an angle formed between the end surface and the first plane is an obtuse angle. Hereinafter, the description of a portion of the same content as that in the first embodiment will not be repeated.

Figure 6:
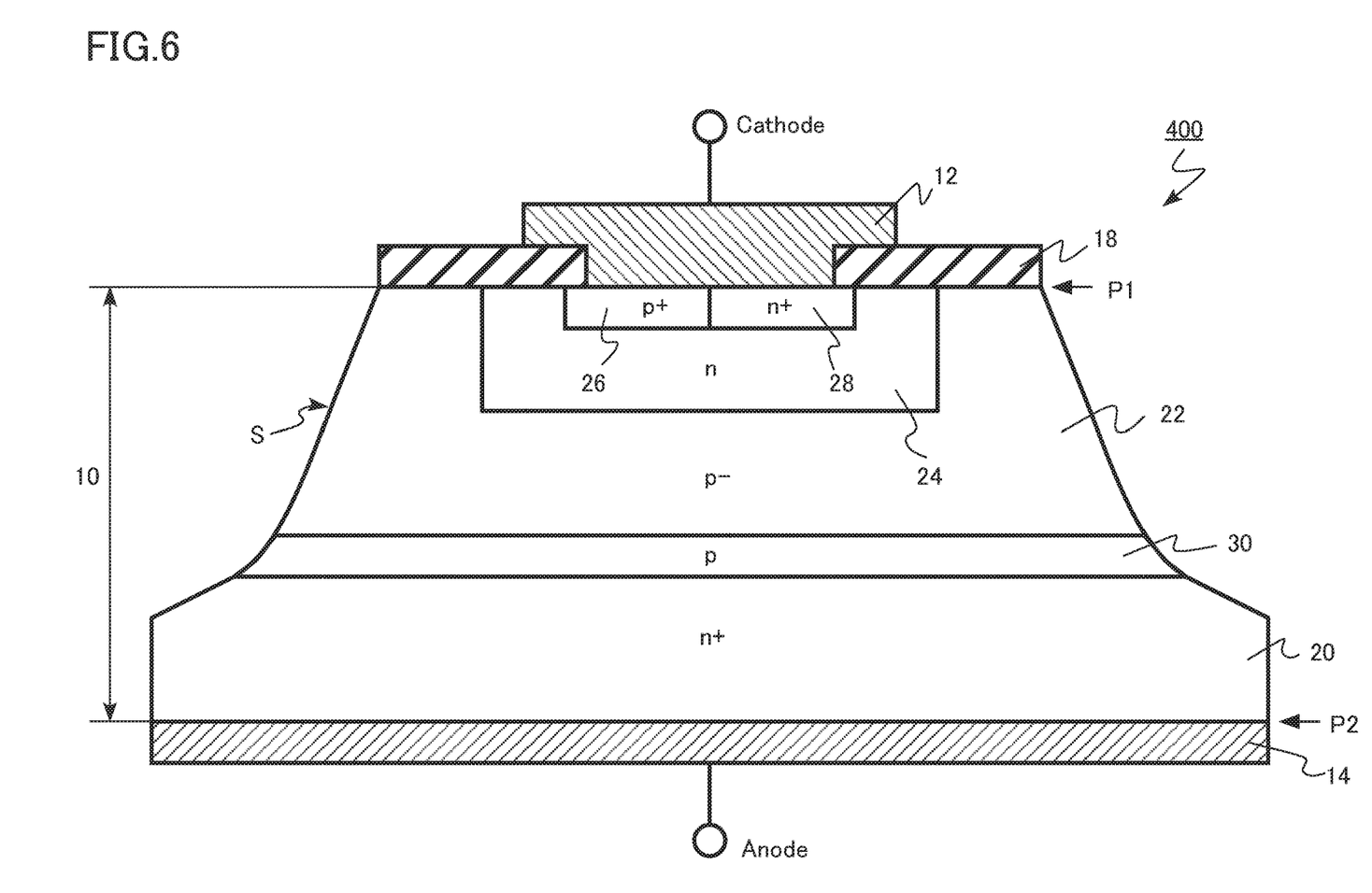
FIG. 6 is a cross-sectional view schematically illustrating a semiconductor device according to a fourth embodiment.

FIG. 6 is a cross-sectional view schematically illustrating the semiconductor device according to the fourth embodiment.

The semiconductor device according to the fourth embodiment is an ESD protection diode 400. The ESD protection diode 400 is an ESD protection diode in which a current can flow in both directions between two electrodes. The ESD protection diode 400 has a structure in which the end surface is inclined, that is, a mesa structure.

Hereinafter, a casein which the first conductivity type is an n type and the second conductivity type is a p type will be described as an example.

The ESD protection diode 400 includes a semiconductor layer 10, a cathode electrode 12 (first electrode), an anode electrode 14 (second electrode), and a protective insulating layer 18.

The semiconductor layer 10 has a first plane (P1 in FIG. 6) and a second plane (P2 in FIG. 6). The first plane P1 is a front surface of the semiconductor layer 10 and the second plane P2 is a rear surface of the semiconductor layer 10.

In addition, the semiconductor layer 10 has an end surface S. The end surface S is located between the first plane P1 and the second plane P2. The end surface S is inclined such that an angle formed between the end surface S and the first plane P1 is an obtuse angle. In other words, the width of the anode region 22 increases from the first plane P1 to the second plane P2.

The semiconductor layer 10 includes an n$^+$ substrate region 20 (first semiconductor region), a p$^-$ anode region 22 (second semiconductor region), an n-type cathode region 24 (third semiconductor region), a p$^+$ first contact region 26 (fourth semiconductor region), an n$^+$ second contact region 28 (eighth semiconductor region), and a p-type first barrier region 30 (fifth semiconductor region).

For example, in a case in which a semiconductor wafer is divided into the ESD protection diodes 400, first, a portion of the substrate region 20 is removed along dicing lines by wet etching. Then, the semiconductor wafer is completely divided into the ESD protection diodes 400 by, for example, blade dicing.

The anode region 22, the first barrier region 30, and the substrate region 20 are partially removed by wet etching to form the inclined end surface S. In the case of wet etching, since physical force is not applied to the end surface S, the crystallinity of the semiconductor layer 10 in the vicinity of the end surface S is less likely to deteriorate.

Therefore, even in a case in which a pn junction between the substrate region 20 with a high n-type impurity concentration and the first barrier region 30 with a high p-type impurity concentration is terminated in the end surface S, a leakage current in the end surface S is suppressed. As a result, the deterioration of the characteristics of the ESD protection diode 400 is suppressed.

As described above, according to the fourth embodiment, similarly to the first embodiment, the connection direction is changed to achieve an ESD protection diode with two hold voltages. In addition, the deterioration of the characteristics of the ESD protection diode caused by a leakage current in the end surface is suppressed.

In the first to fourth embodiments, the case in which the semiconductor layer 10 is made of silicon has been described as an example. However, the semiconductor layer 10 may be made of a semiconductor, such as silicon carbide or nitride semiconductor, other than silicon.

In the first to fourth embodiments, the case in which the first conductivity type is the n type and the second conductivity type is the p type has been described as an example. However, the first conductivity type may be the p type and the second conductivity type may be the n type.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region;
a first electrode provided on a side of the first plane of the semiconductor layer, the first electrode being electrically connected to the third semiconductor region and the fourth semiconductor region; and
a second electrode provided on a side of the second plane of the semiconductor layer, the second electrode being electrically connected to the first semiconductor region, the second electrode not being electrically connected to the second semiconductor region,
wherein the semiconductor layer further includes a second-conductivity-type fifth semiconductor region provided between the first semiconductor region and the second semiconductor region, the fifth semiconductor region having a higher second-conductivity-type impurity concentration than the second semiconductor region, and
the second-conductivity-type impurity concentration of the fifth semiconductor region is equal to or greater than $1 \times 10^{16}$ cm$^{-3}$ and equal to or less than $5 \times 10^{18}$ cm$^{-3}$.

2. The semiconductor device according to claim 1, wherein a thickness of the fifth semiconductor region in a direction perpendicular to the first plane is less than a thickness of the second semiconductor region in the direction.

3. The semiconductor device according to claim 1, wherein the semiconductor layer has an end surface located between the first plane and the second plane,
the second semiconductor region comes into contact with the end surface,
the second semiconductor region comes into contact with the first plane between the end surface and the third semiconductor region, and
the fifth semiconductor region is separated from the end surface.

4. A semiconductor device comprising:
a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region;
a first electrode provided on a side of the first plane of the semiconductor layer, the first electrode being electrically connected to the third semiconductor region and the fourth semiconductor region; and
a second electrode provided on a side of the second plane of the semiconductor layer, the second electrode being electrically connected to the first semiconductor region, the second electrode not being electrically connected to the second semiconductor region,
wherein the semiconductor layer further includes a second-conductivity-type fifth semiconductor region provided between the first semiconductor region and the second semiconductor region, the fifth semiconductor region having a higher second-conductivity-type impurity concentration than the second semiconductor region,
the semiconductor layer has an end surface located between the first plane and the second plane,
the second semiconductor region comes into contact with the end surface,
the second semiconductor region comes into contact with the first plane between the end surface and the third semiconductor region, and
the fifth semiconductor region is separated from the end surface.

5. The semiconductor device according to claim 4, wherein the second semiconductor region is provided between the end surface and the fifth semiconductor region.

6. The semiconductor device according to claim 4, wherein the second-conductivity-type impurity concentration of the fifth semiconductor region is equal to or greater than $1 \times 10^{16}$ cm$^{-3}$ and equal to or less than $5 \times 10^{18}$ cm$^{-3}$.

7. A semiconductor device comprising:
a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region;
a first electrode provided on a side of the first plane of the semiconductor layer, the first electrode being electrically connected to the third semiconductor region and the fourth semiconductor region; and
a second electrode provided on a side of the second plane of the semiconductor layer, the second electrode being electrically connected to the first semiconductor region, the second electrode not being electrically connected to the second semiconductor region, wherein the semiconductor layer further includes a second-conductivity-type fifth semiconductor region provided between the first semiconductor region and the second semiconductor region, the fifth semiconductor region having a higher second-conductivity-type impurity concentration than the second semiconductor region, the semiconductor layer has an end surface located between the first plane and the second plane, the second semiconductor region comes into contact with the first plane between the end surface and the third semiconductor region, and the semiconductor layer further includes a second-conductivity-type sixth semiconductor region provided between the end surface and the second semiconductor region and a first-conductivity-type seventh semiconductor region provided between the end surface and the sixth semiconductor region, the sixth semiconductor region coming into contact with the first plane and the fifth semiconductor region, the seventh semiconductor region coming into contact with the first plane and the first semiconductor region.

8. A semiconductor device comprising:

a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region;

a first electrode provided on a side of the first plane of the semiconductor layer, the first electrode being electrically connected to the third semiconductor region and the fourth semiconductor region; and a second electrode provided on a side of the second plane of the semiconductor layer, the second electrode being electrically connected to the first semiconductor region, the second electrode not being electrically connected to the second semiconductor region, wherein the semiconductor layer further includes a second-conductivity-type fifth semiconductor region provided between the first semiconductor region and the second semiconductor region, the fifth semiconductor region having a higher second-conductivity-type impurity concentration than the second semiconductor region, the semiconductor layer has an end surface located between the first plane and the second plane, the second semiconductor region comes into contact with the first plane between the end surface and the third semiconductor region, and the semiconductor layer further includes an insulator provided between the end surface and the fifth semiconductor region.

9. A semiconductor device comprising:

a semiconductor layer having a first plane and a second plane opposite to the first plane, the semiconductor layer including a first-conductivity-type first semiconductor region, a second-conductivity-type second semiconductor region, a first-conductivity-type third semiconductor region, and a second-conductivity-type fourth semiconductor region, the second semiconductor region being provided between the first semiconductor region and the first plane, the third semiconductor region being provided between the second semiconductor region and the first plane, the third semiconductor region having a lower first-conductivity-type impurity concentration than the first semiconductor region, the fourth semiconductor region being provided between the third semiconductor region and the first plane, the fourth semiconductor region having a higher second-conductivity-type impurity concentration than the second semiconductor region;

a first electrode provided on a side of the first plane of the semiconductor layer, the first electrode being electrically connected to the third semiconductor region and the fourth semiconductor region; and a second electrode provided on a side of the second plane of the semiconductor layer, the second electrode being electrically connected to the first semiconductor region, the second electrode not being electrically connected to the second semiconductor region, wherein the semiconductor layer further includes a first-conductivity-type eighth semiconductor region provided between the third semiconductor region and the first plane, the eighth semiconductor region having a higher first-conductivity-type impurity concentration than the third semiconductor region, the eighth semiconductor region being electrically connected to the first electrode.

* * * * *